United States Patent
Epps et al.

(10) Patent No.: US 9,606,147 B2
(45) Date of Patent: Mar. 28, 2017

(54) APPARATUS FOR HIGH BANDWIDTH CURRENT SENSING

(71) Applicant: GE Aviation Systems LLC, Grand Rapids, MI (US)

(72) Inventors: Philip Henry Richard Epps, Margate, FL (US); Andrew Benjamin Cole, Boca Raton, FL (US); Predrag Hadzibabic, Dix Hills, NY (US)

(73) Assignee: GE AVIATION SYSTEMS LLC, Grand Rapids, MI (US)

( * ) Notice: Subject to any disclaimer, the term of this patent is extended or adjusted under 35 U.S.C. 154(b) by 439 days.

(21) Appl. No.: 14/102,618

(22) Filed: Dec. 11, 2013

(65) Prior Publication Data

US 2015/0091558 A1    Apr. 2, 2015

Related U.S. Application Data

(60) Provisional application No. 61/883,593, filed on Sep. 27, 2013.

(51) Int. Cl.
    *G01R 33/06* (2006.01)
    *G01R 15/20* (2006.01)
    *G01R 15/18* (2006.01)

(52) U.S. Cl.
    CPC .......... *G01R 15/207* (2013.01); *G01R 15/18* (2013.01); *G01R 15/202* (2013.01)

(58) Field of Classification Search
    CPC .. G01R 15/18; G01R 15/207; G01R 31/1272; G01N 27/90; G01V 1/22; H01L 39/126

USPC ........ 324/251, 761.01, 726, 600, 547, 76.11, 324/127, 200, 207.2, 233, 521, 500

See application file for complete search history.

(56) References Cited

U.S. PATENT DOCUMENTS

| | | | | |
|---|---|---|---|---|
| 5,146,156 A | * | 9/1992 | Marcel | G01R 15/202 324/117 H |
| 5,473,244 A | * | 12/1995 | Libove | G01R 1/22 324/126 |
| 5,479,095 A | | 12/1995 | Michalek et al. | |

(Continued)

OTHER PUBLICATIONS

Poulichet et al. A New High-Current Large-Bandwidth DC Active Current Probe for Power Electronics Measurements. IEEE Transactions on Industrial Electronics, vol. 52, No. 1, Feb. 2005.*

*Primary Examiner* — Melissa Koval
*Assistant Examiner* — Trung Nguyen
(74) *Attorney, Agent, or Firm* — GE Global Patent Operation; William S. Munnerlyn

(57) ABSTRACT

A device for measuring electrical current in a line may include, among other things, a Hall effect sensor wherein a first response is generated by electrical current in the line; a current transformer disposed with the line extending axially therethrough and connected in series to the Hall effect sensor wherein a second response is generated by the electrical current in the line. An equalizer may be connected to the Hall effect sensor and to the current transformer and may be configured to flatten the first and second responses relative to each other. The permeability magnetic path length and cross section of the current transformer is selected such that low frequency roll-off of the current transformer is at a lower frequency than high frequency roll-off of the Hall effect sensor.

11 Claims, 2 Drawing Sheets

(56) References Cited

U.S. PATENT DOCUMENTS

| | | | | |
|---|---|---|---|---|
| 7,358,717 B2* | 4/2008 | Dandy | ............... | G01R 1/06766 324/126 |
| 2007/0257657 A1* | 11/2007 | Stevens | .............. | G01R 1/06788 324/72.5 |
| 2007/0257661 A1* | 11/2007 | Mende | ............... | G01R 1/06788 324/117 R |
| 2013/0043888 A1* | 2/2013 | Soar | ......................... | F41H 1/02 324/655 |
| 2013/0257483 A1* | 10/2013 | Bulzacchelli | .... | H03K 3/356139 327/53 |

* cited by examiner

APPARATUS FOR HIGH BANDWIDTH CURRENT SENSING

BACKGROUND OF THE INVENTION

Due, in part, to the advent of silicon carbide (SiC) metal-oxide-semiconductor (MOS) devices, solid-state power switches for power conversion and distribution systems can switch significant levels of power in a relatively short time in comparison to silicon based semiconductors and electromechanical devices. In applications where the load power consists of low frequency alternating current (AC) or direct current (DC), Hall effect devices or resistive sensing are needed. At higher power levels resistive sensing is problematic due to power dissipation or sensing very small voltages and Hall effect sensors typically have inadequate bandwidth. This leads to poor control system bandwidth and the potential for damage under fault conditions.

BRIEF DESCRIPTION OF THE INVENTION

One aspect of the invention relates to a device for providing a wide bandwidth current sensing measurement. The device for measuring electrical current in a line includes: a Hall effect sensor disposed with the line extending axially therethrough wherein a first response is generated by electrical current in the line; a current transformer disposed with the line extending axially therethrough and connected in series to the Hall effect sensor, and having a low permeability core, wherein a second response is generated by the electrical current in the line; and an equalizer connected to the Hall effect sensor and to the current transformer configured to flatten the first and second responses relative to each other. The permeability magnetic path length and cross section is selected such that low frequency roll-off of the current transformer is at a lower frequency than high frequency roll-off of the Hall effect sensor.

Another aspect of the invention relates to a method of measuring electrical current in a line. The method includes the steps of placing the line axially through a Hall effect sensor and axially through a current transformer having a low permeability core, wherein the current transformer is connected in series to the Hall effect sensor, generating a first response from the Hall effect sensor that correlates to a first voltage generated in the Hall effect sensor from electrical current sensed in the line; generating a second response from the current transformer that correlates to a second voltage generated in the current transformer from electrical current sensed in the line; and flattening the first and second responses relative to each other.

DESCRIPTION OF EMBODIMENTS OF THE INVENTION

Figure 1:
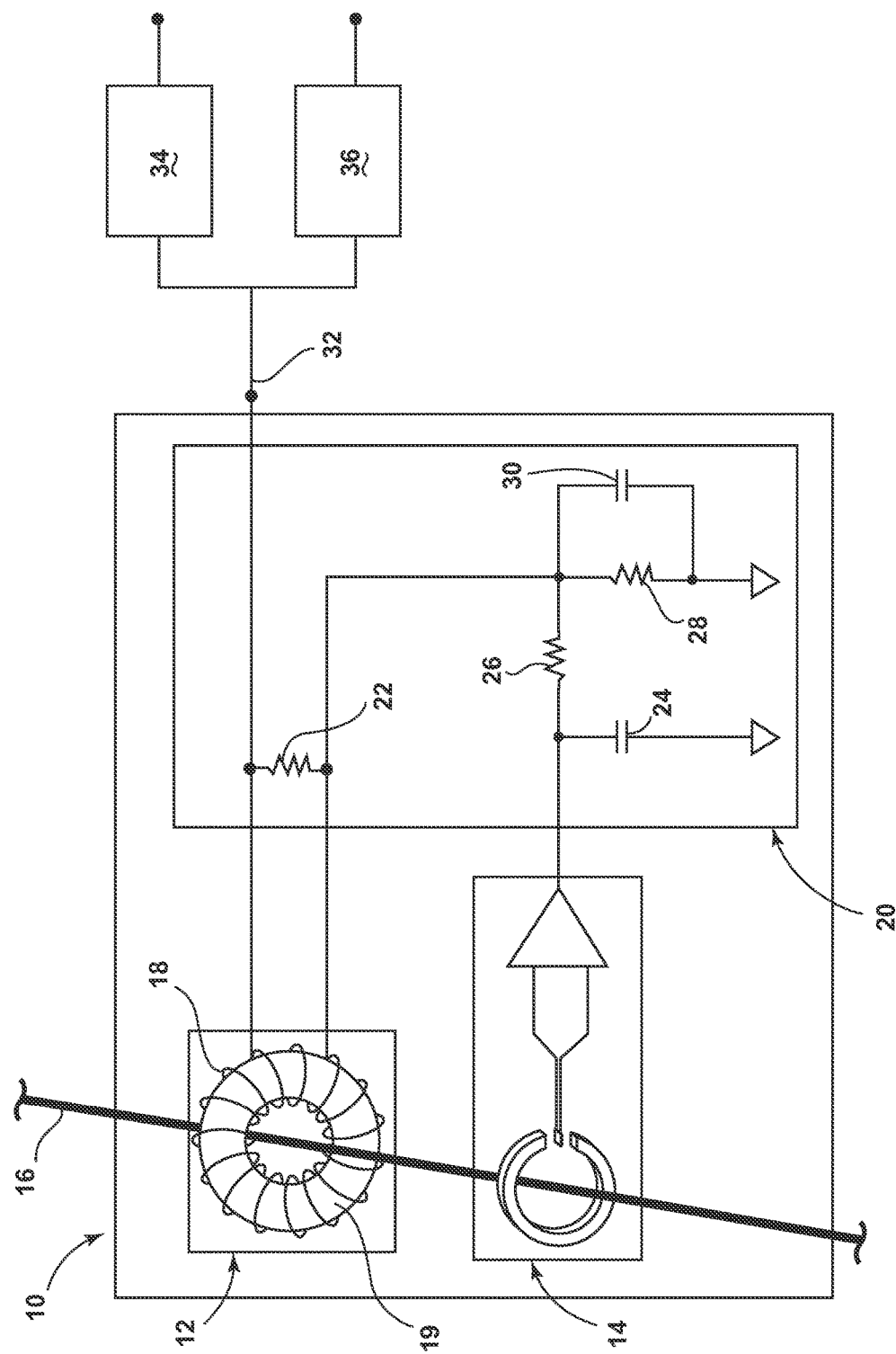
FIG. 1 is a schematic of a wide bandwidth current sensor according to an embodiment of the invention.

Consequently, where wide bandwidth current sensing is required for control and fault detection, there is a need for such a composite current sensor.

In the background and the following description, for the purposes of explanation, numerous specific details are set forth in order to provide a thorough understanding of the technology described herein. It will be evident to one skilled in the art, however, that the exemplary embodiments may be practiced without these specific details. In other instances, structures and devices are shown in diagram form in order to facilitate description of the exemplary embodiments.

The exemplary embodiments are described with reference to the drawings. These drawings illustrate certain details of specific embodiments that implement a module, method, or computer program product described herein. However, the drawings should not be construed as imposing any limitations that may be present in the drawings.

Technical effects of the method disclosed in the embodiments include wider bandwidth control of systems and far superior fault protection. By implementing and configuring the current sensing device with a few relatively simple electrical components, performance and reliability is increased. For example, DC to AC inverters using Silicon Carbide (SiC) switches may be controlled with a system using a wide bandwidth current sensor that can both detect a fault in time to prevent it from causing damage and allow for faster operation of the switch to make full use of the operating characteristics of SiC switches. Of particular utility, the invention disclosed enables wide band sensing of current ranging in frequency from DC to about 5 MHZ.

A current sensor is a device that detects electrical current in a wire and generates a response that is proportional to the level of the electrical current and is a function of the frequency of the current. In general, a current sensor transduces an electrical current into an electrical potential difference. That is, the current sensor outputs a voltage (measured in units of volts) that is proportional to the current (measured in units of amps) in the line under test. For an alternating current in the line, the response in volts per amps is a function of the frequency of the alternating current.

FIG. 1 is a schematic of a wide bandwidth sensor according to an embodiment of the invention. The device 10 consists of two separate current sensors: a current transformer 12 and a Hall effect current sensor 14. The current sensors are connected in series and the responses of the sensors to an input current with respect to frequency along a current carrying line 16 are configured to be complementary.

The current transformer 12 is disposed with the current carrying line 16 extending axially therethrough. The current transformer 12 comprises a core 19 and windings of an insulated conductor 18 around the core 19. The line 16 extends through the core 19. The passage of current through the line 16 induces a current through the windings of the insulated conductor 18. The amplitude of this induced current is the value of the current flowing through the line 16 at the appropriate frequency for the transformer, divided by the number of turns of the insulated conductor 18. The induced current may be measured with one of numerous techniques known. For example, as shown, the current is passed through a burden resistor 22 to generate a voltage proportional to said current. The voltage is supplied as the input to an equalizer 20 to be described below.

The particular material and shape of the elements of a current transformer are typically selected to optimize performance of the current transformer 12 for the expected current amperage and frequency through the line 16. Consequently, many materials and shapes for the constituent parts of the current transformer are contemplated. In one preferred embodiment, the core 19 is toroidal in shape and constructed of a low permeability material, with the line 16 extending axially through the toroidal core 19. The low permeability material is found to provide a current transformer 12 in tandem with a Hall effect sensor 14 with operating characteristics most useful in constructing a wide bandwidth current sensing device. The current transformer 12 may provide an output response proportional to the current level in the high frequency band. For example, the current transformer is preferably configured to measure current from about 10 kHz to about 5 MHz.

The Hall effect sensor which may be of both the open loop or closed loop configuration 14 is disposed with the current carrying line 16 extending axially therethrough. The Hall effect current sensor 14 comprises a magnetic material substantially in the shape of a torus with a small gap therein. The line 16 extends axially through the torus. A conductor or semiconductor is placed in the small gap and is subject to the Hall effect. The Hall effect is produced by the interaction of the magnetic fields produced by the magnetic material in the Hall effect sensor 14 and the current in the line 16. The Hall effect sensor 14 provides an output proportional to the current level of the line 16 for the low frequency region of the alternating current. While many frequency responses are contemplated, preferably, the Hall effect sensor 14 is configured to measure current from DC to above 10 KHz.

In its simplest form the conventional current transformer has its secondary turns and burden resistor selected to generate the identical volts per ampere as the Hall effect device. The permeability magnetic path length and cross section of the current transformer may be selected such that the low frequency roll-off of the current transformer is at a lower frequency than high frequency roll-off of the Hall effect sensor.

To combine the two current sensing devices 12, 14 in series, an equalizer 20 is connected to the Hall effect sensor 14 and to the current transformer 12 and is configured to flatten the first and second responses relative to each other. Equalization is the process of adjusting the balance between frequency components within an electronic signal. While the most well-known use of equalization is in sound recording and reproduction, there are many other applications in electronics and telecommunications. An equalizer strengthens or weakens the energy of specific frequency bands. The equalizer may combine the outputs of the two current sensors in series with some simple frequency shaping. As shown in FIG. 1, the equalizer may be as simple as a combination of the burden resistor 22 along with capacitors 24, 30 and resistors 26, 28. Alternatively, the outputs of the two currents sensors can be combined using separate amplifiers and filters.

Figure 2:
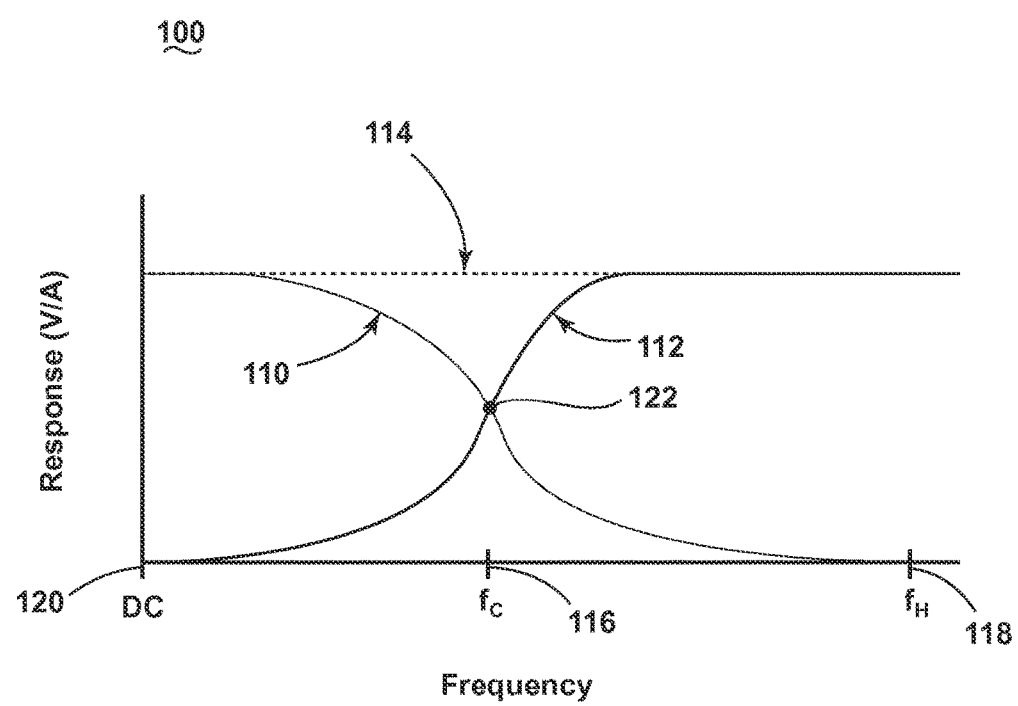
FIG. 2 is a diagram plotting the current response versus frequency of the wide bandwidth current sensing device of FIG. 1 according to an embodiment of the present invention.

To properly combine the outputs of the current transformer 12 and the Hall effect sensor 14, the levels (or magnitudes) of the responses of the two devices must be commensurate and the combination or summation of the responses should be flat across the desired frequency band of the device 10. FIG. 2 is a diagram 100 plotting the current response versus frequency of the wide bandwidth current sensing device of FIG. 1. The Hall effect sensor's response 110 is a low pass response with a peak at DC and then a roll-off. The current transformer's response 112 is a high pass response with a taper (also referred to as a roll-off) at the low frequencies up to some high pass frequency 118. For the frequencies of interest, the response at the high frequencies stays approximately flat above the high pass frequency 118. The low frequency roll-off of the current transformer must be at a lower frequency than the Hall effect sensor's high frequency roll-off. In other words, the responses must intersect at some cutoff frequency 122 at a frequency where both responses are non-zero. A 10 kHz cutoff frequency is preferred though other frequencies may be used. The summation of the two responses 110, 112 forms a flat response 114, ideal for combining the signals of the two current sensors.

Once properly combined by the equalizer 20, the high bandwidth small signal voltage representation of the measured current at 32 from the device 10 may be fed to additional electronic components. Referring again to FIG. 1, for example, an over current detect circuit 34 which may utilize analog or digital circuitry may input the signal for determining fault conditions that may occur when excess current is present in the line 16. In this way, the over current detect circuit may compare the signal at 32 to predetermined setpoints and use embedded logic to trip an over current condition or may use a linear or nonlinear control system to provide control of the current level present in wire 16. Or, where a digital control system 36 is being used such that the bandwidth is further limited by the rate of analog to digital conversion, the analog signal at 32 can be compared directly against either a fixed or programmable reference to indicate exceeding a specific current level in a few tens of nanoseconds to allow for cycle-by-cycle current limiting or for peak current mode control applications. Other circuits connected to the device 10 are contemplated and include an undercurrent detecting circuit for the prevention or mitigation of brown outs or black outs.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A device for measuring electrical current in a line comprising:
   a Hall effect sensor disposed with the line extending axially therethrough wherein a first response is generated by electrical current in the line;
   a current transformer disposed with the line extending axially therethrough and connected in series to the Hall effect sensor, and having a low permeability core, wherein a second response is generated by the electrical current in the line; and
   an equalizer connected to the Hall effect sensor and to the current transformer configured to flatten the first and second responses relative to each other, the equalizer including a circuit to shape the first and second responses,
   wherein a permeability magnetic path length and cross section is selected such that low frequency roll-off of the current transformer is at a lower frequency than high frequency roll-off of the Hall effect sensor.

2. The device of claim 1 wherein the equalizer comprises a circuit to combine the first and second responses.

3. The device of claim 1 further comprising an over current detect circuit connected in series to the device.

4. The device of claim 1 further comprising a phase detector circuit connected in series to the device.

5. The device of claim 1 wherein the Hall effect sensor is configured to measure current from DC to about 10 KHz.

6. The device of claim 1 wherein the current transformer is configured to measure current from about 10 KHz to about 5 MHz.

7. The device of claim 1 wherein the line is connected to a silicon carbide MOS device.

8. A method of measuring electrical current in a line comprising:
   placing the line axially through a Hall effect sensor and axially through a current transformer having a low permeability core, wherein the current transformer is connected in series to the Hall effect sensor;
   generating a first response from the Hall effect sensor that correlates to a first voltage generated in the Hall effect sensor from electrical current sensed in the line;
   generating a second response from the current transformer that correlates to a second voltage generated in the current transformer from electrical current sensed in the line; and
   flattening the first and second responses relative to each other, wherein the flattening is done by shaping the frequency of at least one of the first or second voltages.

9. The method of claim 8 wherein the flattening is done by combining the first and second voltages.

10. The method of claim 9 wherein the combining is done using separate amplifiers and filters for each voltage.

11. The method of claim 8 wherein the sensed current is DC to about 5 MHZ.

\* \* \* \* \*

UNITED STATES PATENT AND TRADEMARK OFFICE
CERTIFICATE OF CORRECTION

PATENT NO. : 9,606,147 B2  
APPLICATION NO. : 14/102618  
DATED : March 28, 2017  
INVENTOR(S) : Epps et al.

Page 1 of 1

It is certified that error appears in the above-identified patent and that said Letters Patent is hereby corrected as shown below:

On the Title Page

In Item (56), under "U.S. PATENT DOCUMENTS", in Column 2, Line 3, delete "Libove" and insert -- Libove et al. --, therefor.

On Page 2, in Item (56), under "U.S. PATENT DOCUMENTS", in Column 1, Line 1, delete "Dandy" and insert -- Dandy et al. --, therefor.

On Page 2, in Item (56), under "U.S. PATENT DOCUMENTS", in Column 1, Line 3, delete "Stevens" and insert -- Stevens et al. --, therefor.

On Page 2, in Item (56), under "U.S. PATENT DOCUMENTS", in Column 1, Line 5, delete "Mende" and insert -- Mende et al. --, therefor.

In the Specification

In Column 3, Line 25, delete "to above" and insert -- to about --, therefor.

In Column 3, Line 26, delete "form" and insert -- form, --, therefor.

Signed and Sealed this  
Fourth Day of July, 2017

Joseph Matal  
*Performing the Functions and Duties of the*  
*Under Secretary of Commerce for Intellectual Property and*  
*Director of the United States Patent and Trademark Office*